United States Patent
Cheng et al.

(10) Patent No.: US 7,385,208 B2
(45) Date of Patent: Jun. 10, 2008

(54) SYSTEMS AND METHODS FOR IMPLANT DOSAGE CONTROL

(75) Inventors: Nai-Han Cheng, Hsinchu (TW); Stock Chang, Hsinchu (TW); Wen-Yuh Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 299 days.

(21) Appl. No.: 11/176,469

(22) Filed: Jul. 7, 2005

(65) Prior Publication Data

US 2007/0023695 A1 Feb. 1, 2007

(51) Int. Cl.
*H01J 37/08* (2006.01)
(52) U.S. Cl. ............... 250/492.21; 250/492.2; 250/492.3; 250/397; 250/398
(58) Field of Classification Search ........... 250/492.21, 250/492.2, 492.3, 397, 398
See application file for complete search history.

(56) References Cited

U.S. PATENT DOCUMENTS

| | | | | |
|---|---|---|---|---|
| 4,743,767 A | * | 5/1988 | Plumb et al. ............ | 250/492.2 |
| 4,761,559 A | * | 8/1988 | Myron .................... | 250/492.2 |
| 6,297,510 B1 | * | 10/2001 | Farley .................... | 250/492.21 |
| 6,646,276 B1 | * | 11/2003 | Mitchell et al. ........ | 250/492.21 |
| 6,797,967 B1 | * | 9/2004 | Tse et al. ................ | 250/492.21 |
| 6,965,116 B1 | * | 11/2005 | Wagner et al. ......... | 250/492.21 |
| 7,253,423 B2 | * | 8/2007 | Chang et al. ........... | 250/492.21 |
| 2004/0195528 A1 | * | 10/2004 | Reece et al. ............ | 250/492.21 |
| 2005/0133728 A1 | * | 6/2005 | Onat et al. .................. | 250/397 |
| 2006/0097196 A1 | * | 5/2006 | Graf et al. ............. | 250/492.21 |
| 2007/0114456 A1 | * | 5/2007 | Yasuda .................... | 250/492.21 |

FOREIGN PATENT DOCUMENTS

JP         06103955 A   *   4/1994

* cited by examiner

*Primary Examiner*—Jack I. Berman
*Assistant Examiner*—Michael J Logie
(74) *Attorney, Agent, or Firm*—Thomas, Kayden, Horstemeyer & Risley

(57) ABSTRACT

A system for implantation dosage control. A first interface receives scan position information. A second interface receives beam current information specifying a first beam current value between scans and a plurality of second beam current values during one of the scans. A controller, determines a tolerance range according to the first beam current value, determines whether the second beam current values exceeds the tolerance range, and calculates number of the second beam current values exceeding the tolerance range.

20 Claims, 7 Drawing Sheets

SYSTEMS AND METHODS FOR IMPLANT DOSAGE CONTROL

BACKGROUND

The invention relates generally to process control, and more particularly to implant dosage control.

Ion implanters, commonly used in semiconductor manufacturing, implant ions into semiconductor substrates to change conductivity of the material in such substrates or in pre-defined regions thereof. Ion implanters generally comprise an ion source for generating an ion beam, a mass analyzer for selecting a particular species of ions from the ion beam, and means to direct the mass-selected ion beam through a vacuum chamber onto a target substrate supported on a substrate holder.

Typically, cross-sectional area of the ion beam at the target substrate is less than the surface area of the substrate which necessitates scanning of the beam over the substrate using a one or two-dimensional scan so that the beam covers the entire surface of the substrate. In the semiconductor manufacturing, it is critical to ensure that for any selected species of ions the wafers are implanted with the correct ion dose and that the dosage is uniform throughout and across the wafer or the part of the wafer targeted to receive the implanted ions. The dosage delivered during an implant process is monitored by measuring beam current using a beam current detector (such as a Faraday cup) positioned behind a wafer. As the beam and the wafer effect movement one relative to the other so that the beam is no longer obstructed by the wafer, the beam can fall on the beam current detector. Where implantation of multiple wafers is concerned, this may be achieved by positioning the beam current detector behind the movable wafer holder with one or more gaps/slits in the holder through which the beam can pass to the beam current detector that is aligned with the general path of the ion beam. Where single wafer implantation occurs, the beam current detector will normally be placed in a fixed position behind the wafer so that the beam impinges on the beam current detector as the wafer is moved out of alignment with the ion beam after each single traverse of the ion beam across the wafer.

Referring to FIG. 1, position voltage measures and corresponding beam current measurements are shown. Conventional beam current detectors measure beam current between transits of the ion beam across a wafer, when the ion beam is not obstructed by a wafer (as shown in point A) Therefore, the true beam current of the ion beam patterning the wafer cannot be obtained using the conventional method.

SUMMARY

An exemplary embodiment of a system for implantation dosage control comprises a first interface, a second interface, and a controller. The first interface receives scan position information. The second interface receives beam current information specifying a first beam current value between scans and a plurality of second beam current values during one of the scans. The controller, determines a tolerance range according to the first beam current value, determines whether the second beam current values exceed the tolerance range, and calculates the number of the second beam current values exceeding the tolerance range.

A method of implant dosage control is provided. In an exemplary embodiment, scan position information is received, specifying scan position voltages for an ion beam scanning across a target substrate. Beam current information is received, specifying a first beam current value between scans and a plurality of second beam current values during one of the scans. A tolerance range for the second beam current value is then determined according to the first beam current value. It is determined whether the second beam current values exceed the tolerance range. The number of the second beam current values exceeding the tolerance range is then calculated. When the number of second beam current values exceeding the tolerance range exceeds a preset value, an alarm is triggered, indicating an unstable implant dosage. When the number of successive second beam current values exceeding the tolerance range exceeds a preset threshold, a wafer charging alarm is generated, specifying a wafer charging situation.

A method for implanting a wafer with an ion beam is provided. An ion beam is provided from an ion source. Ion dose measurements and corresponding scan position values for the ion beam scanning a target substrate are provided, wherein the ion dose measurements comprise first beam current information measured between scans and second beam current information obtained during one of the scans. It is determined whether the second beam current information conforms to preset criteria based on the first beam current information, and the ion source is adjusted accordingly.

DESCRIPTION OF THE DRAWINGS

The invention can be more fully understood by reading the subsequent detailed description and examples with references made to the accompanying drawings, wherein.

DETAILED DESCRIPTION

Exemplary embodiments of the invention will now be described with reference to FIGS. 2 through 6, which generally relate to an implantation system. While some embodiments of the invention are applied in an implantation system within which wafers are supported on a rotating disk, it is understood that implantation systems with other types of wafer support mechanism may be implemented.

In the following detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense. The leading digit(s) of reference numbers appearing in the Figures corresponds to the Figure number, with the exception that the same reference number is used throughout to refer to an-identical component which appears in multiple Figures.

Figure 1:
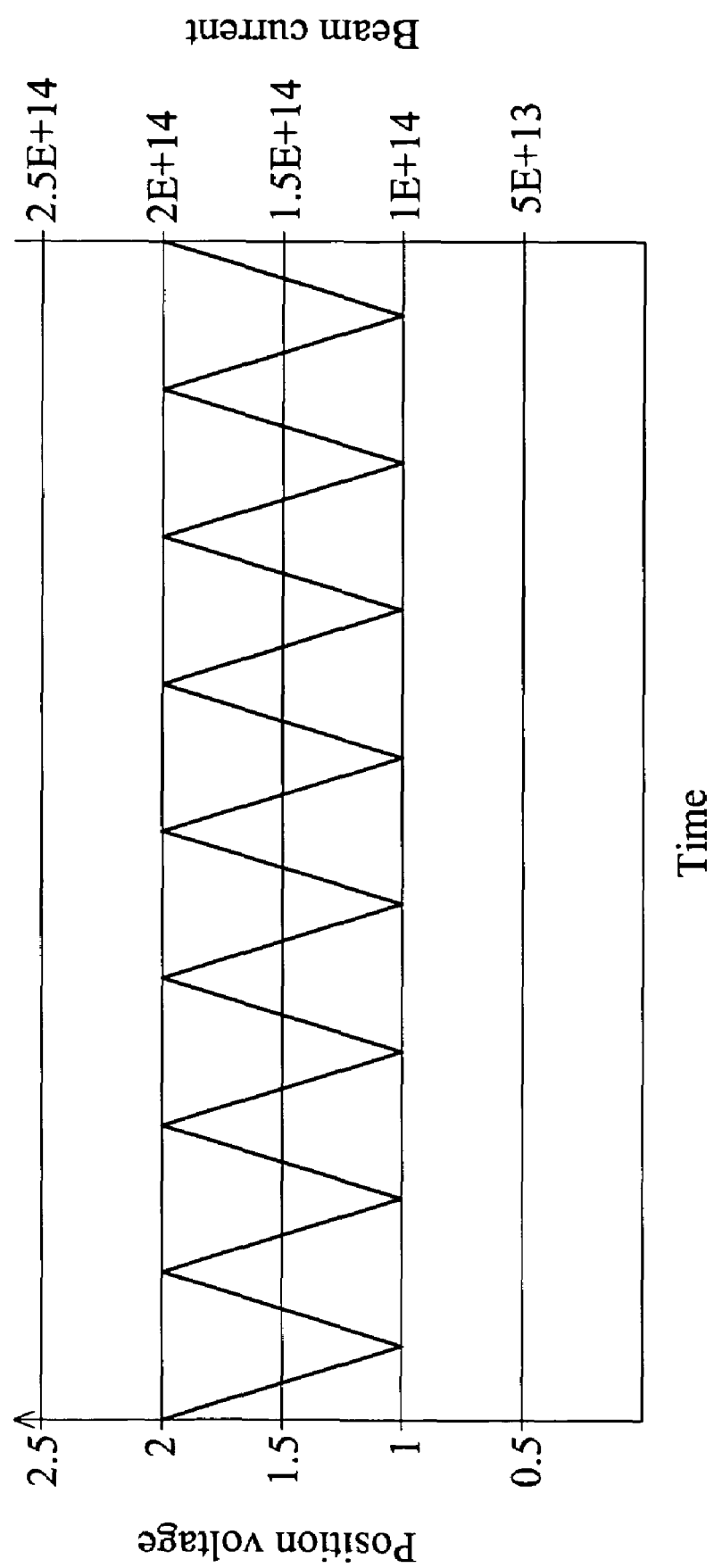
FIG. 1 illustrates position voltage values and corresponding beam current measurements obtained from a conventional implantation system.
Figure 2A:
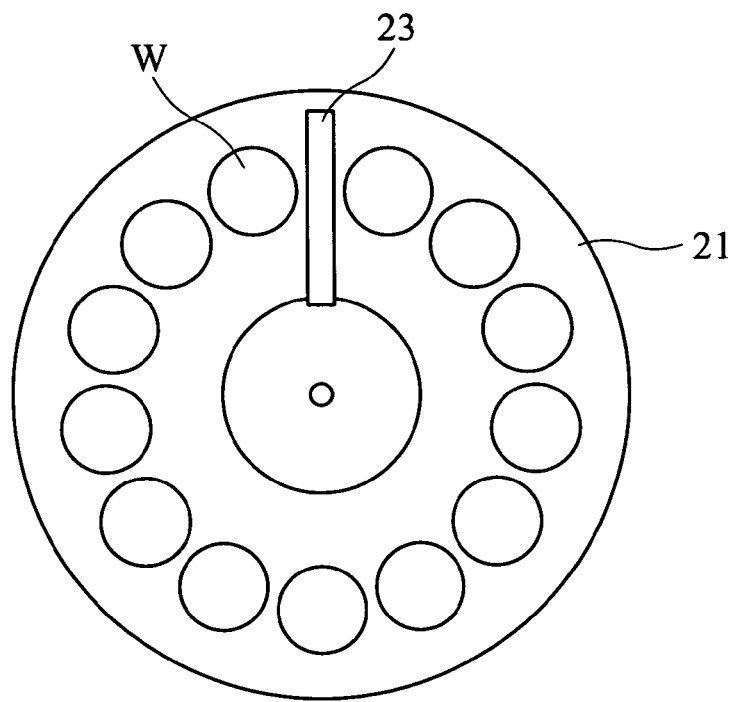
FIGS. 2A and 2B are schematic views of a spinning disk and wafers in an embodiment of an implantation system.
Figure 2B:
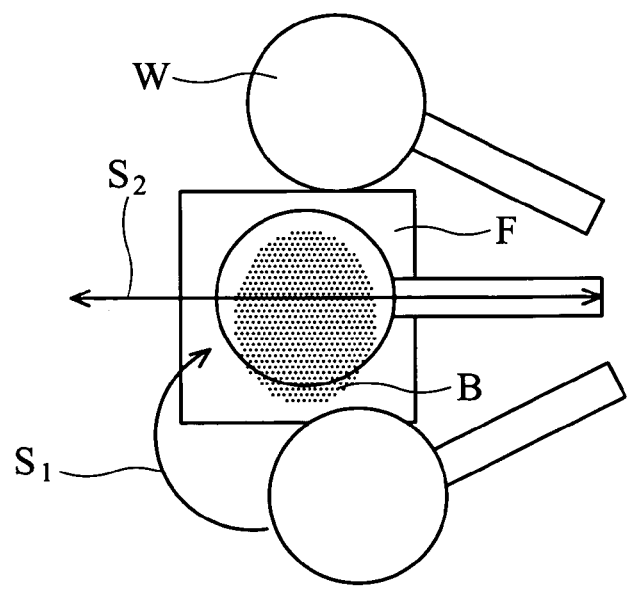

FIG. 2A is a schematic view of a spinning disk and wafers in an embodiment of an implantation system. Wafers W are mounted on a spinning disk 21, which may rotate around a first axis at approximately 800~1200 rpm, shown as $S_1$ in FIG. 2B. A second axis of motion enables the spinning disk 21 to be moved laterally so as to move the stationary beam B radially with respect to the spinning disk 21, shown as $S_2$ in FIG. 2B. A beam current striking spinning disk 21 is measured by a beam current detector (illustrated as square F in FIG. 2B) positioned at the rear side of the disk 21. A slot 23 (shown in FIG. 2A) is provided in the disk 21 at a suitable location between the wafers from near the outer edge of the disk to the innermost radial position. As the spinning disk 21 rotates, an ion beam passes through the disk once every revolution, and strikes the beam current detector. Beam current measurements obtained during each revolution are fed to a control mechanism (detailed in the following description). The control mechanism controls the movement of the spinning disk 21 to achieve a uniform implant dosage upon semiconductor wafers during an ion implantation.

Spinning disk 21 may be an aluminum disk, providing sufficient thermal conductivity and inertness to contamination of the semiconductor wafers. Aluminum also has a reasonably good heat capacity and it provides adequate rigidity for the high-speed rotating disk. The spinning disk 21 may be dish-shaped and has an angle in the region at which the wafers are mounted. The tilt prevents channeling of the ions in the silicon structure. It also provides a component of centrifugal force to keep the wafers firmly seated on the disk. The centrifugal force component is also important in promoting good thermal contact between the wafer and the disk even if other clamping means are provided. To assure that the initial position of an ion beam is at the extreme outer radial edge of the disk, outside of the location of the wafers, a limit switch (not shown) on the drive carriage assembly is checked by the digital control before initiating an implantation process. When the implantation process begins, the entire spinning disk 21 is moved laterally, with the disk moving through the beam the prescribed number of scans and at a velocity consistent with the measured beam intensity and the required dosage. On completion of the scan of the disk and after it is determined that the disk has returned to the initial position with the beam located at the outer edge of the spinning disk 21, the implantation process is complete, and the disk is reloaded.

Slot 23 in spinning disk 21 extends inward from just inside the outer circumference of the spinning disk 21. The outermost edge of the wafers provides room for the beam to be completely outside the wafers initially. This allows the beam to have begun its controlled inward velocity before reaching the wafers.

Figure 2C:
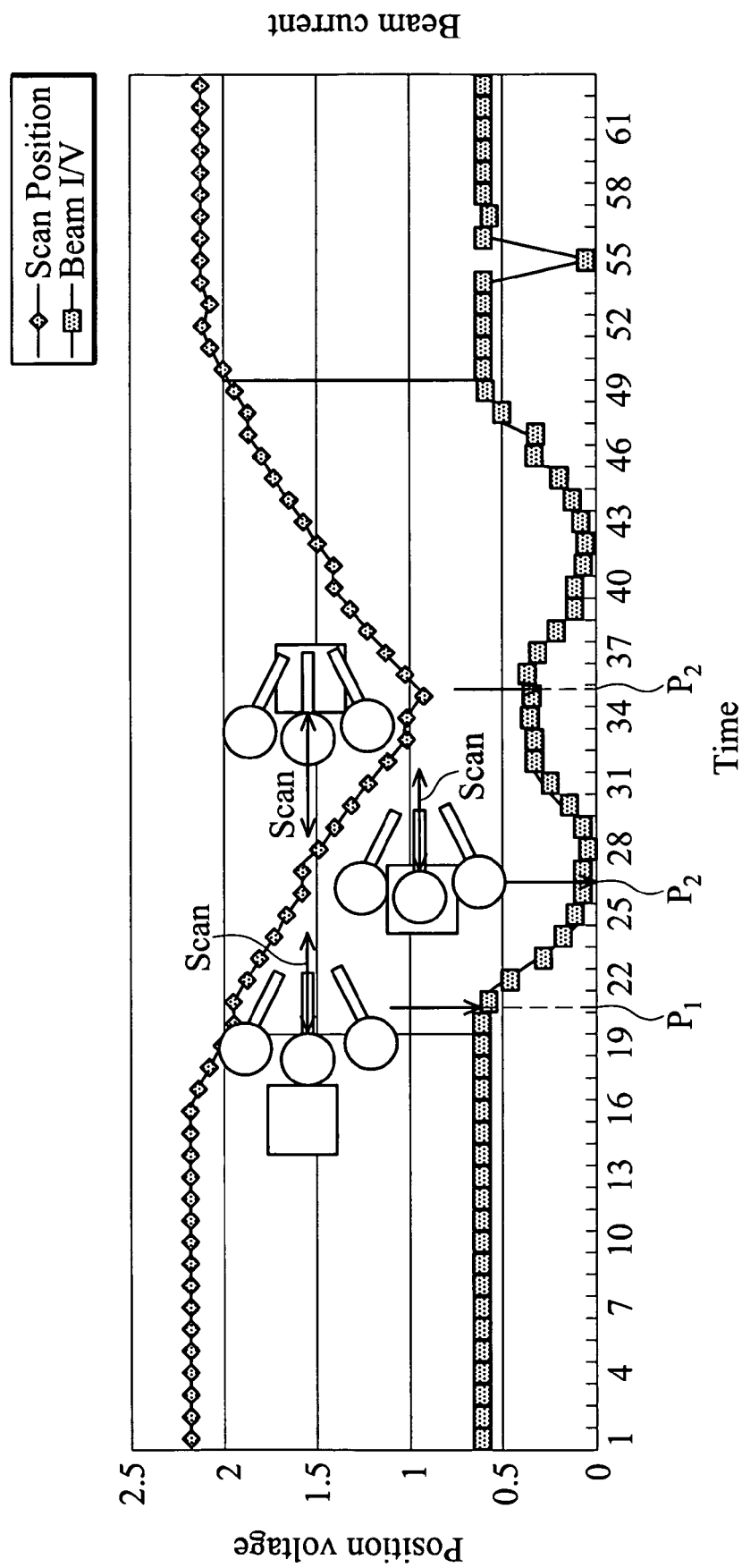
FIG. 2C shows a schematic views of scan position of ion beam and the corresponding beam current measurements.

The beam current striking spinning disk 21 can be measured by a beam current detector, such as a Faraday cup, positioned on the back side of the disk 21. FIG. 2C shows the scan position of the ion beam and the corresponding beam current measurement. When the ion beam strikes a wafer, the detected ion beam current measurement is lower, as shown in $P_2$ of FIG. 2C. When ion beam does not strike the wafer, the detected ion beam current measurement is higher, as shown in $P_1$ and $P_3$ of FIG. 2C.

Figure 3:
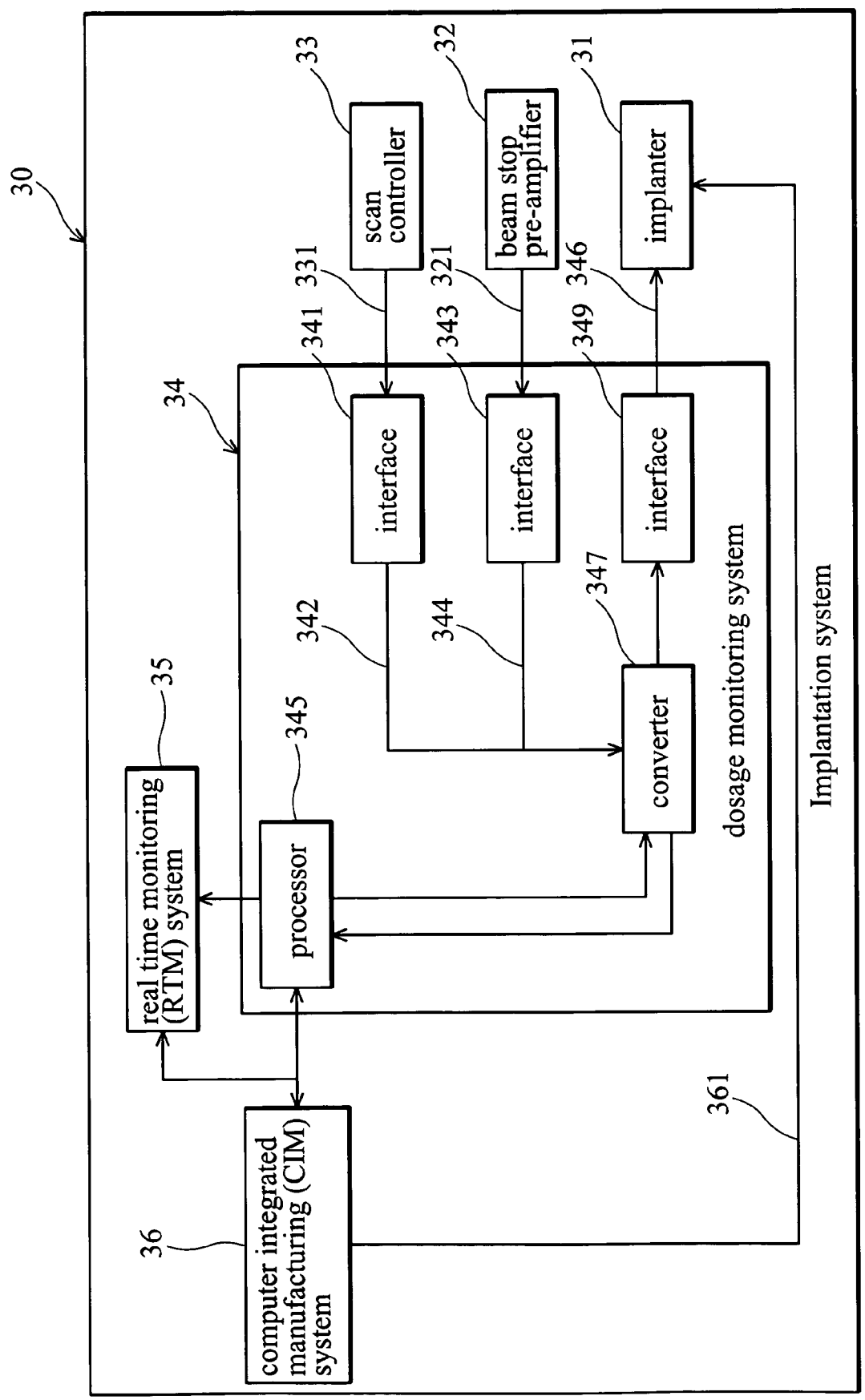
FIG. 3 is a schematic view of an embodiment of an implantation system.
Figure 4:
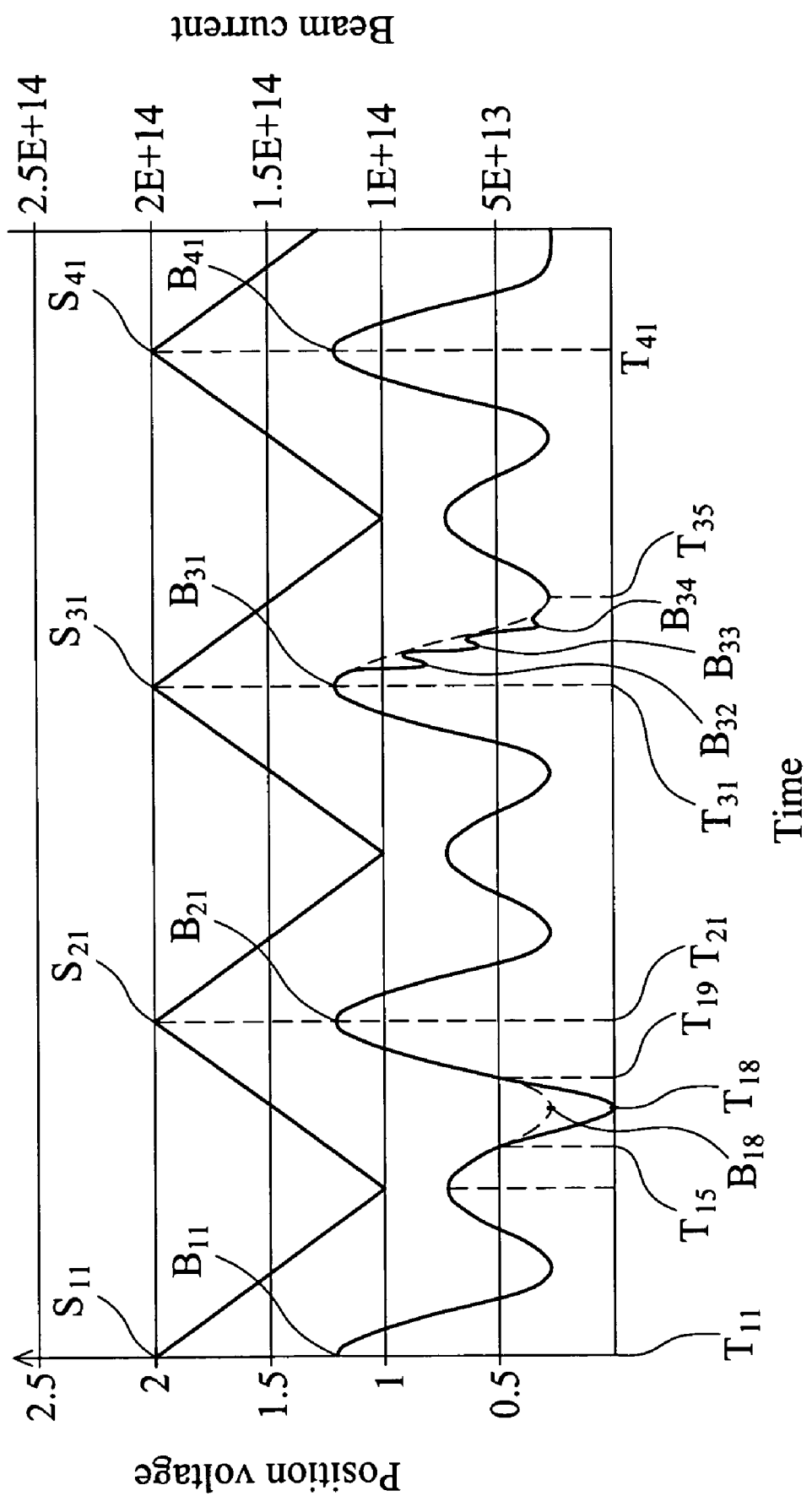
FIG. 4 illustrates position voltage values and corresponding beam current measurements obtained from an embodiment of an implantation system.

FIG. 3 is a schematic view of an embodiment of an implantation system. Implantation system 30 comprises an implanter 31, a beam stop pre-amplifier 32, a scan controller 33, a dosage monitoring system 34, a real time monitoring (RTM) system 35, and a computer integrated manufacturing (CIM) system 36. The dosage monitoring system 34, RTM system 35, and CIM system 36 cooperate to control implantation processes performed by the implanter 31. During an implantation process, the dosage monitoring system 34 receives scan position information 331 from the scan controller 33 via an interface 341. The scan position information 331 is not typically utilized for implant dosage control in a conventional implanter. In order to convert the scan position information 331 to a digital form, the interface 341 comprises an analog-to-digital converter converting the received scan position information into a corresponding digital signal. Additionally, during an implantation process, the dosage monitoring system 34 receives beam current measurement 321 from the beam stop pre-amplifier 32 via an interface 343. In order to convert the beam current measurement 321 to a corresponding digital signal, the interface 343 comprises an analog-to-digital converter converting the received beam current measurement 321 into a corresponding digital signal. The interface 343 receives beam current information specifying a first beam current value between scans and a plurality of second beam current values during one of the scans. Referring to FIG. 4, when the scan position information specifies a scan position voltage value of 2, i.e. at scan positions $S_{11}$, $S_{21}$, $S_{31}$, and $S_{41}$, an ion beam does not strike a wafer, and a relatively high beam current measurement (referred to as the first beam current value) is obtained. For example, at time $T_{11}$, $T_{21}$, $T_{31}$, and $T_{41}$, beam current values $B_{11}$, $B_{21}$, $B_{31}$, and $B_{41}$ are obtained. When an ion beam position moves from scan position S11 to S21, the ion beam completes a 'scan' across a wafer. A plurality of beam current measurements (referred to as the second beam current values) is obtained during a scan. The beam current measurements obtained during a scan may be obtained at a relatively high sampling rate, such as 5 measurements per second. The first and second beam current values can be used for monitoring implant dosage during an implantation process.

The converted scan position information 342 and converted beam current measurement 344 are then sent to a processor 345. The processor 345 determines a tolerance range according to the first beam current values, determines whether any of the second beam current values exceeds the tolerance range, and calculates the number of second beam current values exceeding the tolerance range. When the number of the out-of-tolerance-range second beam current values exceeds a preset limit, a dosage monitoring information is generated according to the scan position information and the beam current measurements, and is transferred to the RTM system 35 and/or CIM system 36. The CIM system 36 controls the ion implanter 31 according to the dosage monitoring information by transmitting a control signal 361 to implanter 31. Additionally, the CIM system 36 transmits signals to the RTM system 35 and dosage monitoring system 34, thus the RTM system 35 and dosage monitoring system 34 can be adjusted accordingly. The dosage monitoring system 34 may transmit a signal 346 to the implanter 31, thus the implanter 31 can be adjusted accordingly. The implanter 31 communicates with the dosage monitoring system 34 via an interface 349.

A converter 347 may be implemented between the interfaces 341 and 343 and processor 245. The converter 347 may be a RS485/232 converter or other suitable type of converter.

Figure 5:
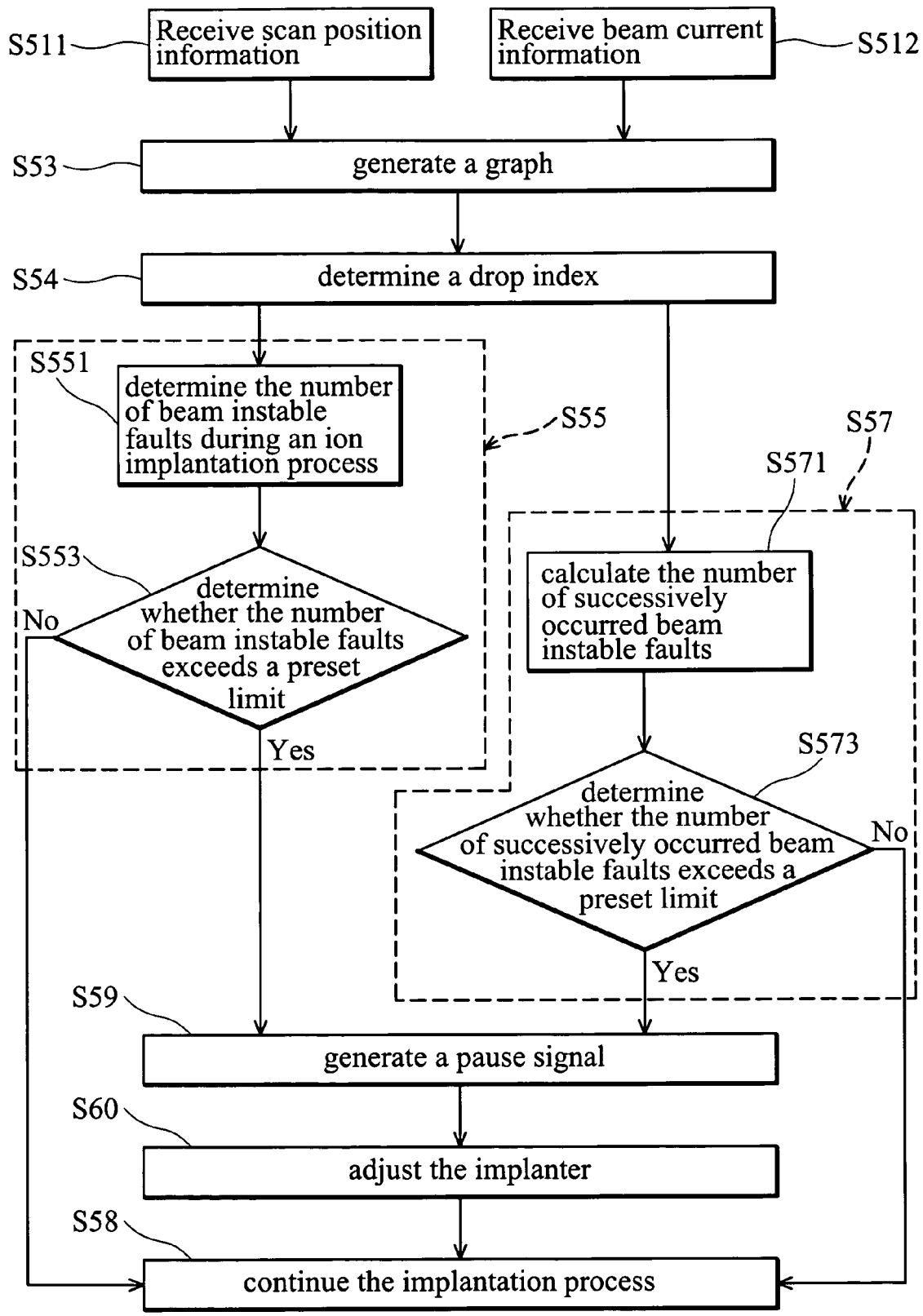
FIG. 5 is a flowchart of an embodiment of an implant dosage control method.
Figure 6:
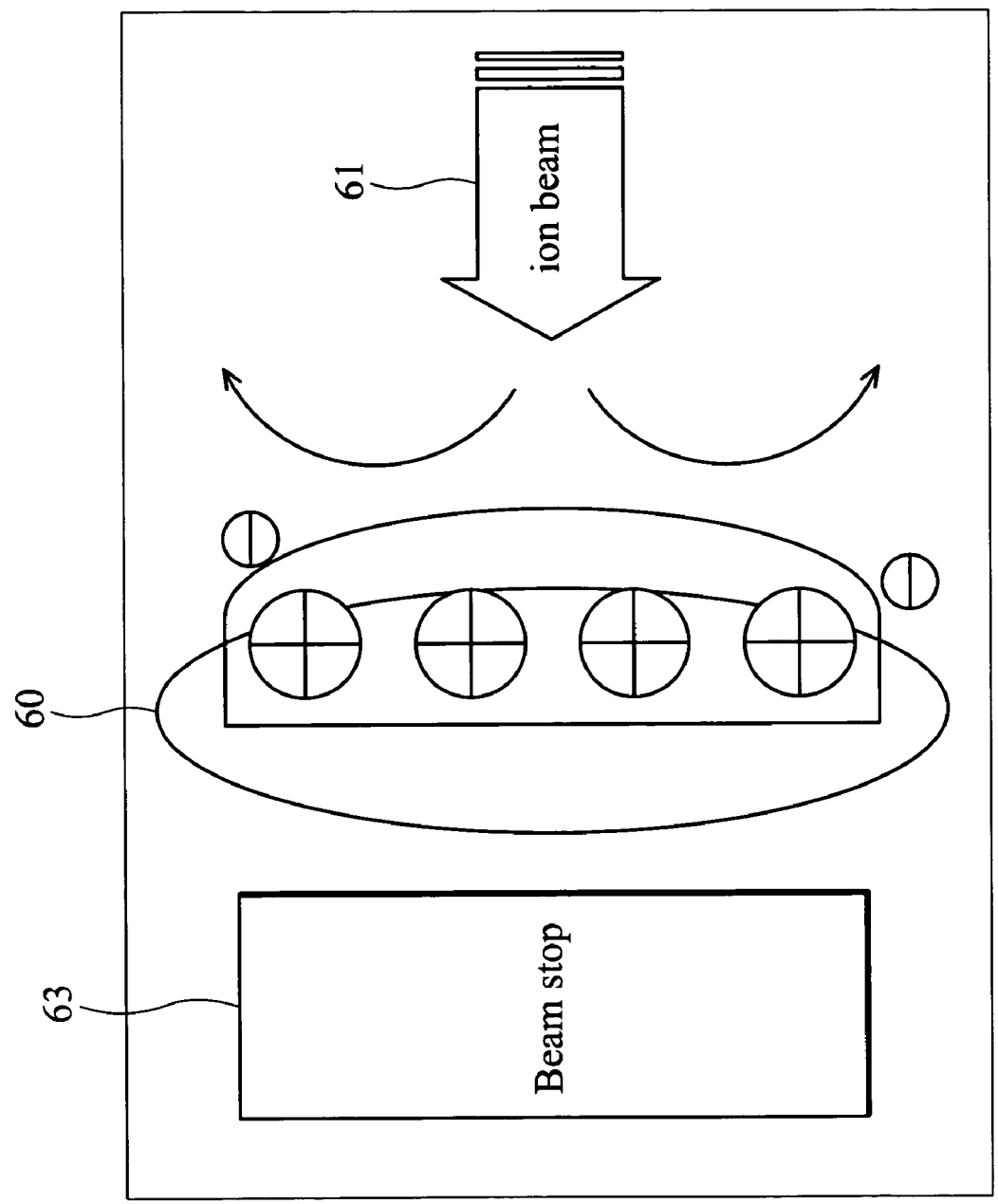
FIG. 6 is a schematic view of a wafer charging effect.

The processing algorithm implemented in dosage monitoring system 34 is detailed in the flowchart of FIG. 5. Scan position information is received in step S511. The scan position information comprises scan position voltage values obtained from a scan controller of an implanter. As shown in FIG. 4, when the scan position voltage is between 2.0V to 2.2V, the beam current does not strike a wafer, and a larger part of the ion beam shot from an ion source is detected by a beam current detector, such as a Faraday Cup. When the scan position voltage is around 1.5V, the beam current strikes a wafer at the center thereof, and a smaller part of the ion beam shot from an ion source is detected by a Faraday Cup. Beam current information is received in step S512. The beam current information specifies a first beam current value between scans and a plurality of second beam current values during one of the scans. The scan position information and the beam current information can be used to generate a graph in step S53, as shown in FIG. 4. The received information and the graph generated in step S53 can be used for further analysis. In step S54, a drop index is determined. Here, the drop index is the ratio of a standard beam current value to the beam current values detected when an ion beam is scanning across a wafer. The standard beam current value can be the mean of a plurality of the first beam current measurements. The beam current values detected when an ion beam is traversing across a wafer can be the second beam current measurement. Here, the first beam current measurements are beam current measurements corresponding to scan position of voltage 2.0V to 2.2V. A drop index exceeding a preset value indicates that the second beam current measurement may be too low based on the standard beam current value. In other words, the drop index exceeding the preset value indicates a beam unstable error. The preset value can be determined to meet special needs. Here, the preset value is set as 14.

In step S55, a beam stabilization control process is performed. In step S551, the number of the drop index exceeding the preset value, i.e., beam unstable errors, during an implantation process is determined. As described, the preset value for calculation the number of beam unstable errors is set as 14 in this embodiment. For example, referring to FIG. 4, during time $T_{31} \sim T_{35}$, beam unstable errors occur around beam current measurements $B_{32}$, $B_{33}$, and $B_{34}$. In step S553, it is determined whether the number of beam unstable errors exceeds a preset limit, and if so, the method proceeds to step S59, otherwise, the method proceeds to step S58. In step S59, a pause signal is generated, suspending a current implantation process. When the implantation process is suspended, a recipe reset may be performed, and the ion implantation process run may be restarted using the reset recipe. In step S58, the implantation process continues.

In step S57, a charging monitoring process is performed. One potential problem encountered during ion implantation is an unacceptable degree of electrical charging (wafer charging) on the wafer surface. When wafer charging occurs, an ion beam shot from an ion source may be expelled by the charge carried on the wafer surface, and the beam current detected by a beam detector may be higher than the one detected when wafer charging does not occur. Referred to FIG. 6, when the wafer surface 60 is positively charged, an ion beam 61 carrying a positive charge is expelled from the wafer surface 60, and the beam current detected by a detector at the beam stop 63 declines. The beam current decrease becomes more obvious when the ion beam strikes the center of the wafer. In other words, the beam current drop becomes more obvious at a scan position voltage value around 1.5V. Referring to FIG. 4, at time $T_{18}$, the scan position voltage is 1.5V, and the beam current measurement $B_{18}$ is approximately 0. Around $T_{18}$, for example, from $T_{15}$ to $T_{19}$, the corresponding beam current measurements decrease. A lower beam current measurement corresponds to a drop index exceeding the preset value 14. As described, a drop index exceeding the preset value indicates a beam unstable error. Accordingly, there may be a series of succeeding beam unstable errors when a wafer charging effect occurs. The charging monitoring process detects whether a wafer charging effect occurs. In step S571, the number of successively occurring beam unstable errors is calculated. In step S573, it is determined whether the number of successively occurred beam unstable errors exceeds a preset limit. The preset limit may be determined to meet special needs. Here, the preset limit is set to 5. When 5 or more beam unstable errors occur successively, the method proceeds to step S59, otherwise, the method proceeds to step S58. In step S59, a pause signal is generated for suspending the current ion implantation process run. In step S60, the implanter is adjusted to achieve uniform implantation. When the ion implantation process run is suspended, a recipe reset may be performed, and the ion implantation process run may be restarted using the reset recipe. In step S58, the implantation process continues.

While the invention has been described by way of example and in terms of several embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for implantation dosage control, comprising:
a first interface receiving scan position information;
a second interface receiving beam current information specifying a first beam current value between scans and a plurality of second beam current values during one of the scans; and
a controller, determining a tolerance range according to the first beam current value, determining whether the second beam current values exceeds the tolerance range, and calculating number of the second beam current values exceeding the tolerance range.

2. The system of claim 1, wherein the first interface comprises an analog-to-digital converter converting the received scan position information into a corresponding digital signal.

3. The system of claim 1, wherein the second interface comprises an analog-to-digital converter converting the received beam current information into a corresponding digital signal.

4. The system of claim 1, wherein the controller further generates an alarm when the number of the second beam current values exceeding the tolerance range exceeds a preset value.

5. The system of claim 4, further comprising a third interface transferring a signal to an implanter.

6. The system of claim 5, wherein the third interface comprises a digital-to-analog converter converting the signal to corresponding analog signal.

7. The system of claim 5, wherein the controller further transmits the alarm to a real time monitor (RTM), receives a control signal from the RTM, and transmits the control signal to the implanter via the third interface.

8. The system of claim 5, wherein the controller further transmits the alarm to a computer integrated manufacturing (CIM) system, receives a control signal from the CIM system, and transmits the control signal to the implanter via the third interface.

9. The system of claim 1, wherein the controller further generates a wafer charging alarm when the number of successive second beam current values exceeding the tolerance range exceeds a preset threshold.

10. A method for implant dosage control, comprising:
receiving scan position information;
receiving beam current information specifying a first beam current value between scans and a plurality of second beam current values during one of the scans;
determining a tolerance range for the second beam current value according to the first beam current value;
determining whether the second beam current values exceed the tolerance range; and
calculating number of the second beam current values exceeding the tolerance range.

11. The method of claim 10, further generating an alarm when the number of the second beam current values exceeding the tolerance range exceeds a preset value.

12. The method of claim 11, further transmitting the alarm to a real time monitor (RTM), receiving a control signal from the RTM, and transmitting the control signal to an implanter.

13. The method of claim 11, further transmitting the alarm to a computer integrated manufacturing (CIM) system, receiving a control signal from the CIM system, and transmitting the control signal to an implanter.

14. The method of claim 10, further generating a wafer charging alarm when the number of successive second beam current values exceeding the tolerance range exceeds a preset threshold.

15. The method of claim 14, further transmitting the wafer charging alarm to a real time monitor (RTM), receiving a control signal from the RTM, and transmitting the control signal to an implanter.

16. The method of claim 14, further transmitting the wafer charging alarm to a computer integrated manufacturing (CIM) system, receiving a control signal from the CIM system, and transmitting the control signal to an implanter.

17. A method for implanting a wafer with an ion beam, comprising:
providing an ion beam from an ion source;
providing ion dose measures and corresponding scan position values for the ion beam scanned across a target substrate, wherein the ion dose measures comprises first beam current information measured between scans and second beam current information during one of the scans; and
determining whether the second beam current information conforms to preset criteria based on the first beam current information, and adjusting the ion source accordingly.

18. The method of claim 17, further determining a tolerance range for the second beam current information according to the first beam current information.

19. The method of claim 18, further determining whether the second beam current values exceeds the tolerance range, calculating number of the second beam current values exceeding the tolerance range, and generating an alarm when the number of the second beam current values exceeding the tolerance range exceeds a preset value.

20. The method of claim 18, further determining whether the second beam current values exceeds the tolerance range, and generating a wafer charging alarm when the number of successive second beam current values exceeding the tolerance range exceeds a preset threshold.

* * * * *